United States Patent
LaBerge (10) Patent No.: US 7,526,704 B2
(45) Date of Patent: Apr. 28, 2009

(54) TESTING SYSTEM AND METHOD ALLOWING ADJUSTMENT OF SIGNAL TRANSMIT TIMING

(75) Inventor: Paul A. LaBerge, Shoreview, MN (US)

(73) Assignee: Micron Technology, Inc., Boise, ID (US)

(*) Notice: Subject to any disclaimer, the term of this patent is extended or adjusted under 35 U.S.C. 154(b) by 690 days.

(21) Appl. No.: 11/210,406

(22) Filed: Aug. 23, 2005

(65) Prior Publication Data

US 2007/0046309 A1 Mar. 1, 2007

(51) Int. Cl.
*G06F 11/00* (2006.01)

(52) U.S. Cl. .................................... 714/744; 714/798

(58) Field of Classification Search ............... None
See application file for complete search history.

(56) References Cited

U.S. PATENT DOCUMENTS

| | | | | |
|---|---|---|---|---|
| 5,586,093 A | | 12/1996 | Honda et al. .................. 369/32 |
| 5,812,562 A | * | 9/1998 | Baeg .......................... 714/726 |
| 6,000,022 A | | 12/1999 | Manning ..................... 711/167 |
| 6,157,955 A | | 12/2000 | Narad et al. ................. 709/228 |
| 6,181,638 B1 | | 1/2001 | Jeddeloh ..................... 365/233 |
| 6,279,090 B1 | | 8/2001 | Manning ..................... 711/167 |
| 6,282,589 B1 | | 8/2001 | Porterfield et al. ............ 710/52 |
| 6,295,246 B2 | | 9/2001 | Jeddeloh ..................... 365/233 |
| 6,338,127 B1 | | 1/2002 | Manning ..................... 711/167 |
| 6,366,991 B1 | | 4/2002 | Manning ..................... 711/167 |
| 6,397,344 B1 | | 5/2002 | Jeddeloh ..................... 713/600 |
| 6,401,117 B1 | | 6/2002 | Narad et al. ................. 709/223 |
| 6,414,903 B1 | | 7/2002 | Keeth et al. .................. 365/233 |
| 6,584,036 B2 | | 6/2003 | Kurjanowicz et al. ....... 365/233 |
| 6,594,805 B1 | | 7/2003 | Tetelbaum et al. ............ 716/5 |
| 6,629,222 B1 | | 9/2003 | Jeddeloh ..................... 711/167 |
| 6,658,523 B2 | | 12/2003 | Janzen et al. ................ 711/105 |
| 6,687,185 B1 | | 2/2004 | Keeth et al. .................. 365/233 |
| 6,697,926 B2 | | 2/2004 | Johnson et al. .............. 711/167 |
| 6,724,846 B1 | | 4/2004 | Lo .............................. 375/354 |
| 6,732,205 B2 | | 5/2004 | Kamihara et al. ............. 710/71 |
| 6,763,416 B1 | | 7/2004 | LaBerge ..................... 710/305 |
| 6,765,931 B1 | | 7/2004 | Rabenko et al. ............. 370/493 |
| 6,775,755 B2 | | 8/2004 | Manning ..................... 711/167 |
| 6,813,674 B1 | | 11/2004 | Velasco et al. .............. 710/311 |
| 6,857,089 B2 | * | 2/2005 | Schaber et al. .............. 714/724 |
| 6,888,826 B1 | | 5/2005 | Martin et al. ................ 370/359 |
| 6,901,475 B2 | | 5/2005 | Porterfield ................... 710/310 |
| 6,910,093 B2 | | 6/2005 | Porterfield ................... 710/316 |
| 6,920,576 B2 | | 7/2005 | Ehmann ...................... 713/400 |
| 6,950,350 B1 | | 9/2005 | Kerl ............................ 365/193 |
| 7,284,169 B2 | * | 10/2007 | LaBerge et al. ............. 714/718 |
| 2002/0004926 A1 | * | 1/2002 | Erickson ..................... 714/814 |

* cited by examiner

*Primary Examiner*—Christine T Tu
(74) *Attorney, Agent, or Firm*—Dorsey & Whitney LLP (57) ABSTRACT

A test system includes respective clock domain crossing circuits coupling memory device signals to a memory device being tested. The clock domain crossing circuit includes a ring buffer into which the respective memory device signal is latched responsive to a first clock signal. The particular buffer into which the memory device signal is latched is determined by a write pointer, which is incremented by the first clock signal. The outputs of the buffers are applied to a multiplexer, which is controlled by a read pointer to couple a memory device signal from one of the buffers to the memory device. The read pointer is incremented by a second clock signal having a timing that is adjustable and may be different from the second clock signal used to increment the read pointer in a clock domain crossing circuit for a different memory device signal.

29 Claims, 9 Drawing Sheets

(PRIOR ART)

FIGURE 1

(PRIOR ART)

TESTING SYSTEM AND METHOD ALLOWING ADJUSTMENT OF SIGNAL TRANSMIT TIMING

TECHNICAL FIELD

This invention relates to testing devices for integrated circuits such as memory devices, and, more particularly, to a relatively inexpensive method and system for high speed testing of integrated circuits.

BACKGROUND OF THE INVENTION

During the fabrication of such integrated circuits as memory devices, it is conventional to test the integrated circuits at several stages during the fabrication process. For example, the integrated circuits are normally connected to a tester with a probe card when the integrated circuits are still in wafer form. In a final test occurring after the integrated circuits have been diced from the wafer and packaged, the integrated circuits are placed into sockets on a load board. The load board is then placed on a test head, typically by a robotic handler. The test head makes electrical contact with conductors on the load board, and these conductors are connected to the integrated circuits. The test head is connected through a cable to a high-speed tester so that the tester can apply signals to and receive signals from the integrated circuits.

While the above-described testing environment works well in many applications, it is not without its limitations and disadvantages. For example, it is very difficult to test various timing characteristics of the integrated circuits, particularly at the high operating speeds for which such integrated circuits are designed. This difficulty results primarily from the propagation delays in transferring signals through the cable between the tester to the test head. The cables that are typically used in such testing environments are often fairly long, thus making the propagation delays of signals coupled to and from the integrated circuits correspondingly long and often difficult to predict.

Figure 1:
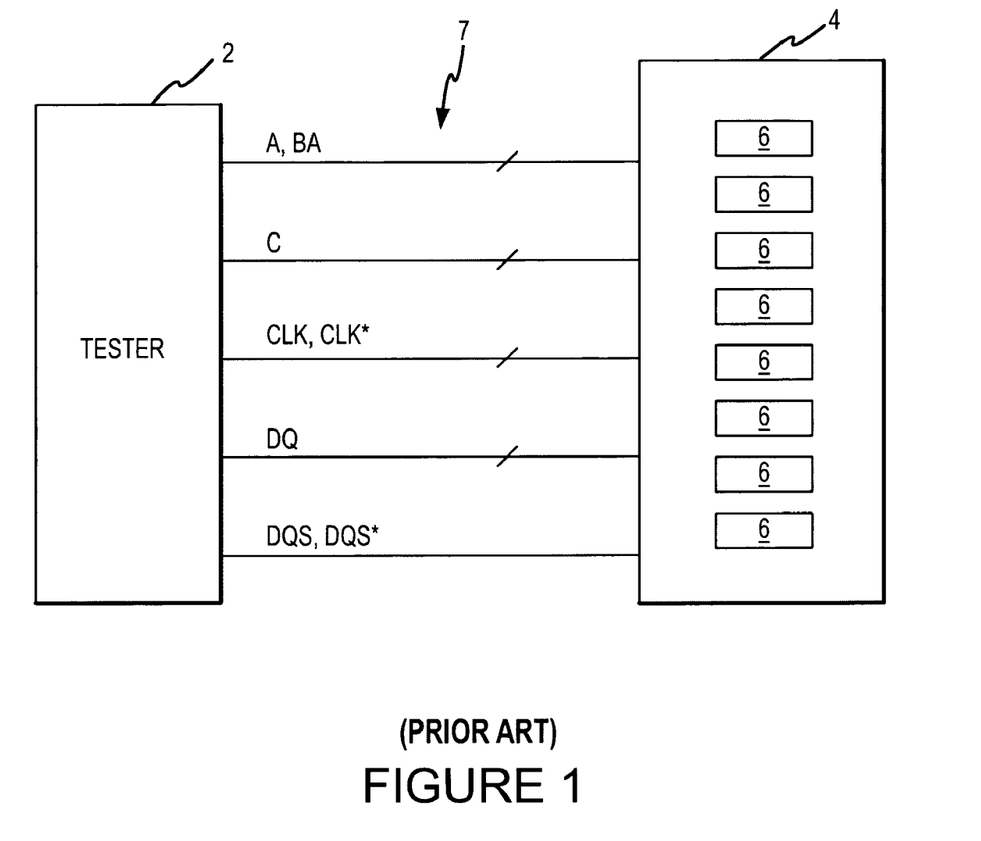
FIG. 1 is a block diagram of a prior art tester connected to an integrated circuit load board containing several dynamic random access memory ("DRAM") devices.

With reference to FIG. 1, a conventional tester 2 is coupled to a load board 4 containing several integrated circuits, which, in this example, are dynamic random access memory ("DRAM") devices 6. The load board 4 is connected to the tester 2 through sets of signal lines, which are represented in FIG. 1 as buses 7. A first set of lines couples respective address ("A") signals and bank address ("BA") signals from the tester 2 to the load board 4, and a second set of signal lines couples respective command ("C") signals from the tester 2 to the load board 4. These command signals may be, for example, a row address select ("RAS") signal, a column address select ("CAS") signal, a write enable ("WE") signal, a reset ("R") signal, a chip select ("CS") signal, an on-die termination ("ODT") signal, and a clock enable ("CKE") signal. A third set of signal lines couples respective clock ("CLK") and complementary clock ("CLK*") signals from the tester 2 to the load board 4. A fourth set of signal lines couples respective data ("DQ") signals from the tester 2 to the load board 4. Finally, a fifth set of signal lines couples a data strobe ("DQS") signal and a complementary data strobe ("DQS*") signal from the tester 2 to the load board 4.

Techniques have been developed to allow the tester 2 to deal with the propagation delays in transferring signals from the tester 2 to the load board 4. For example, in many testers, such as the tester 2 shown in FIG. 1, the tester 2 can vary the timing at which each set of signals are applied to the load board 4. Thus, for example, the timing at which the address A and bank address BA signals are applied to the load board 4 can be adjusted independently of the timing at which the DQ signals are applied to the load board 4. In some cases, the tester 2 can vary the timing at which each signal is applied to the load board 4 on a signal-by-signal basis so that, for example, the timing at which individual DQ signals are applied to the load board 4 can be adjusted independently of each other.

While these and other techniques have been developed to allow the tester 2 to deal with the propagation delays in transferring signals from the tester 2 to the load board 4, these techniques result in testers that are highly complex and often very expensive. A large number of testers are normally required for a high capacity semiconductor fabrication plant, thus greatly increasing the cost of the plant and the expense of testing the integrated circuits.

Figure 2:
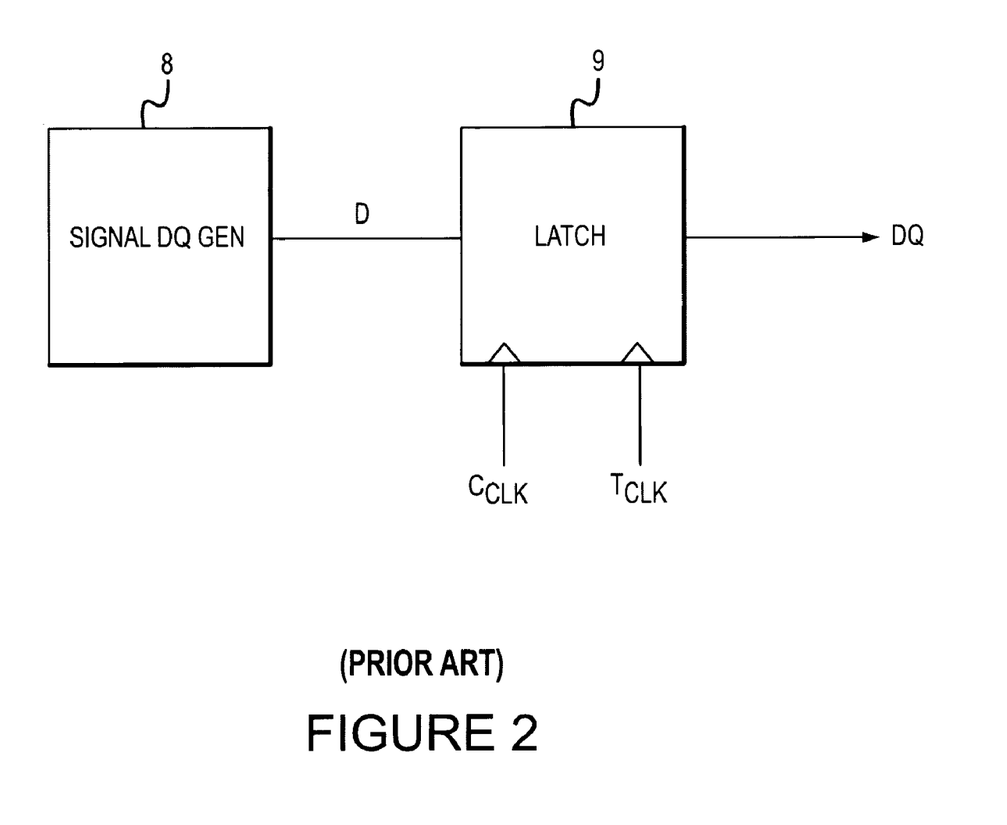
FIG. 2 is a block diagram of a portion of the components of the tester shown in FIG. 1.

Another problem with conventional testers, such as the tester 2 shown in FIG. 1, results from a limited range of adjustment at which they can adjust the timing of signals applied to the load board 4. The problem is exemplified by the block diagram of a portion of the tester 2 shown in FIG. 2 and the accompanying timing diagram shown in FIG. 3. With reference to FIG. 2, the tester 2 (FIG. 1) typically includes a signal generator 8 that generate signals, such as a data ("D") signal, which may have a fixed timing in relation to the other signals generated by the tester 2, e.g., address signals, command signals, etc. The D signal is applied to a latch 9 and is stored in the latch 9 responsive to a core clock ("$C_{CLK}$") signal. The stored D signal is clocked out of the latch to provide the DQ signal responsive to a transmit clock ("$T_{CLK}$") signal. The tester 2 is able to vary the timing of the $T_{CLK}$ signal to adjust the timing at which the DQ signal is applied to the load board 4.

Figure 3:
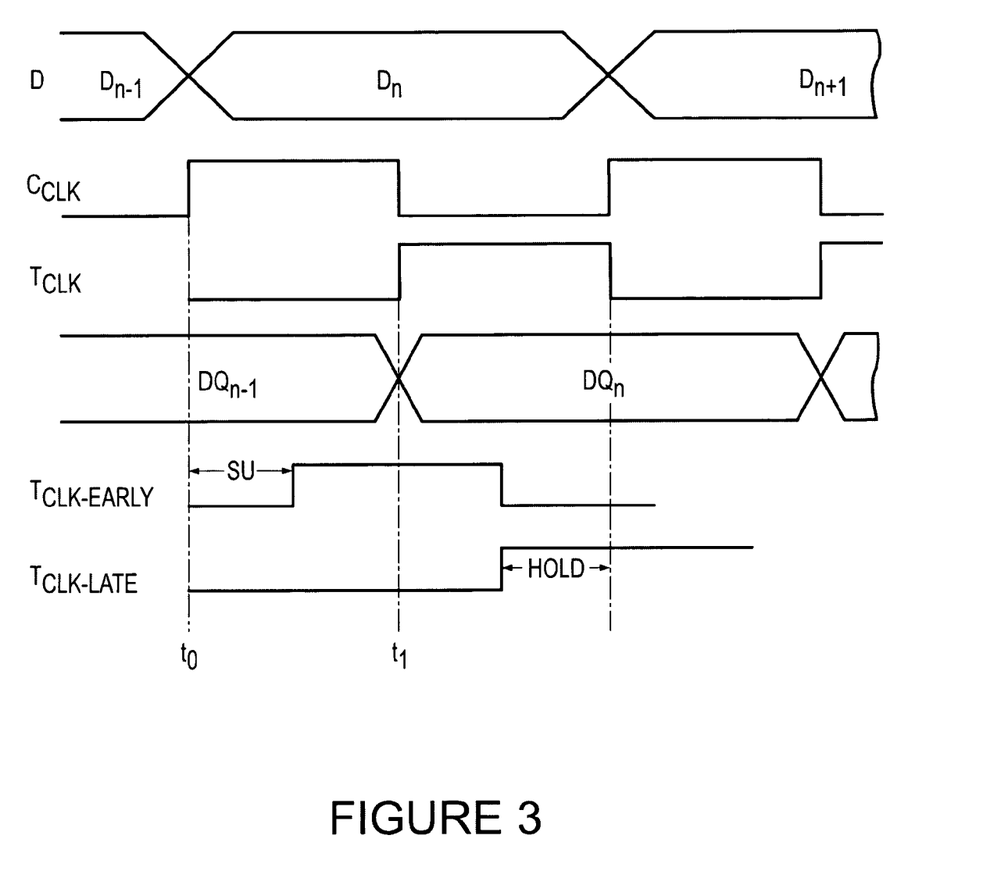
FIG. 3 is a timing diagram showing some of the signals that are present in the tester components shown in FIG. 2.

The relationship between the D, DQ, $C_{CLK}$ and $T_{CLK}$ signals is shown in FIG. 3. A bit Dn of the D signal is clocked into the latch 9 by the rising edge of the $C_{CLK}$ signal at time $t_0$. At time $t_1$, the stored D signal is clocked out of the latch 9 by the rising edge of the $T_{CLK}$ signal to generate bit DQn of the DQ signal. To apply the DQn signal to the load board at an earlier time, the timing of the $T_{CLK}$ signal is reduced to the signal $T_{CLK-EARLY}$, which is also shown in FIG. 3. However, the $T_{CLK-EARLY}$ signal clocking the D signal out of the latch 9 must follow the time $t_0$ when the $C_{CLK}$ signal clocks the D signal into the latch 9 by a minimum set-up time SU. Similarly, to apply the DQn signal to the load board at a later time, the timing of the $T_{CLK}$ signal is increased to the signal $T_{CLK-LATE}$, which is also shown in FIG. 3. However, the D signal clocked into the latch 9 by the $C_{CLK}$ signal at time $t_0$ must be held in the latch for a minimum HOLD time until the next D signal is clocked into the latch 9 by the next $C_{CLK}$ rising edge. As a result, the $T_{CLK-LATE}$ signal clocking the D signal out of the latch 9 can occur no later than the HOLD time after the $C_{CLK}$ has clocked the D signal into the latch 9. The rising edge of the $T_{CLK}$ signal must therefore occur after the $T_{CLK-EARLY}$ signal and before the $T_{CLK-LATE}$ signal. As a result, the range of timing adjustment of the $T_{CLK}$ signal is limited, thereby limiting the timing at which the DQ signal can be applied to the load board 4 (FIG. 1). For this reason, the tester 2 may be unable to compensate for large variations in the times at which the tester 2 applies signals to the load board 4.

There is therefore a need for a testing system and method that can allow the timing of signals applied to an integrated circuit load board to be adjusted over a relatively wide range, thereby allowing the testing system and method to compensate for large variations in propagation times of signals applied to the load board.

SUMMARY OF THE INVENTION

A system and method of testing integrated circuits such as memory devices includes a test signal generator generating a plurality of test signals. The test signals are applied to a timing control circuit that is coupled to the integrated circuit. The timing control circuit latches each of the test signals responsive to a first clock signal, and it applies the latched test signals to the integrated circuit responsive to a respective second clock signal. The timing of the second clock signal to which the timing control circuit is responsive is adjustable relative to the timing of the second clock signal. The timing circuit may include a plurality of ring buffers into which respective test signals are latched responsive to the first clock signal. The test signals are applied to the integrated circuit from the ring buffer responsive to respective ones of the second clock signals.

DETAILED DESCRIPTION

Figure 4:
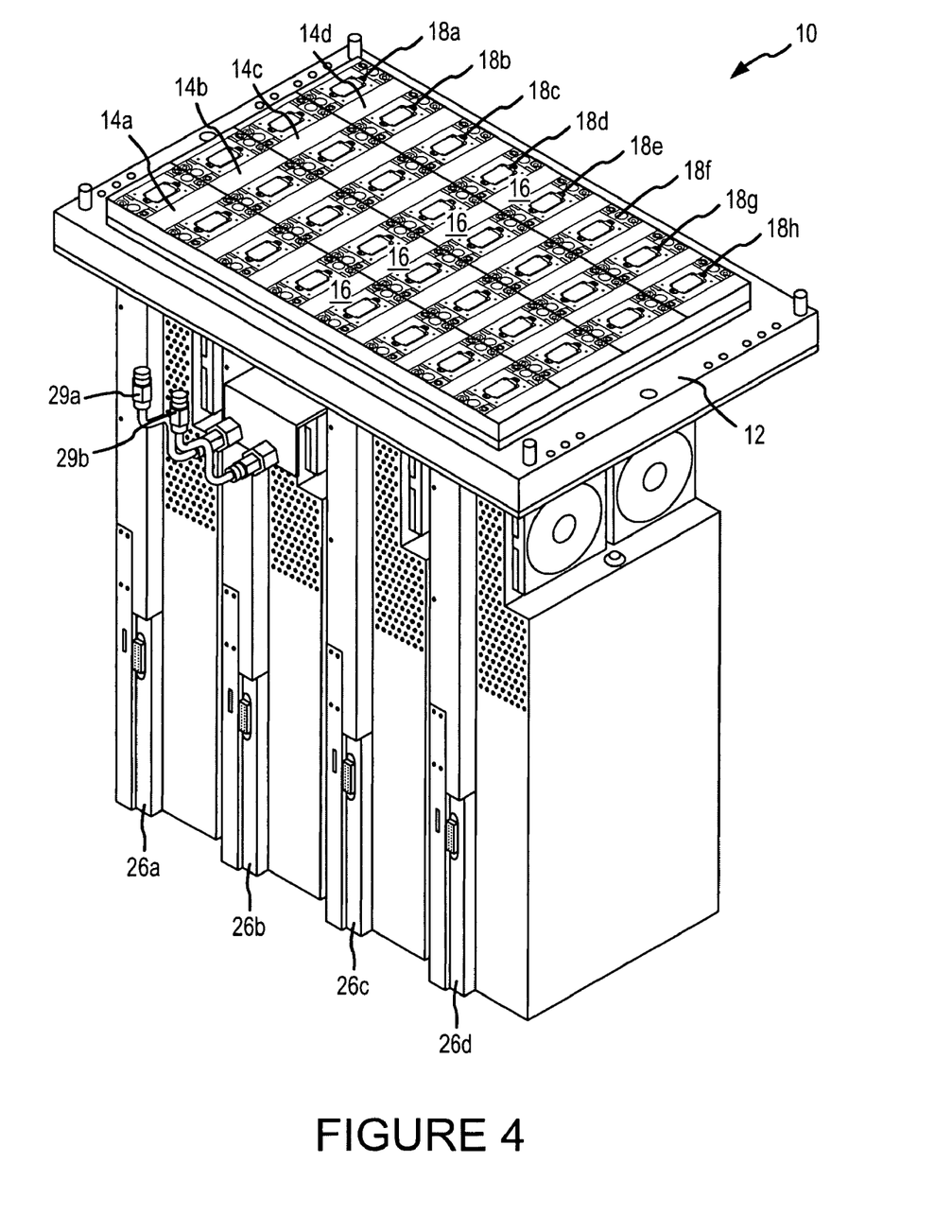
FIG. 4 is an isometric view of a test system according to one example of the invention.

A test system 10 according to one example of the invention is illustrated in FIG. 4. The test system 10 includes a test head 12 on which several load boards 14a-d are placed. Each of the load boards 14a-d have a printed circuit substrate 16 on which several integrated circuit sockets 18a-h are mounted. Each of the integrated circuit sockets 18a-h receives a respective integrated circuit (not shown in FIG. 4). In the example shown in FIG. 4, the sockets 18a-h are adapted to receive integrated circuit memory devices, such as dynamic random access memory ("DRAM") devices. Prior to final testing of the integrated circuits, an integrated circuit handler (not shown) loads an integrated circuit into each of the sockets 18a-h, and then places each of the load boards 14a-d on the test head 12.

Figure 5A:
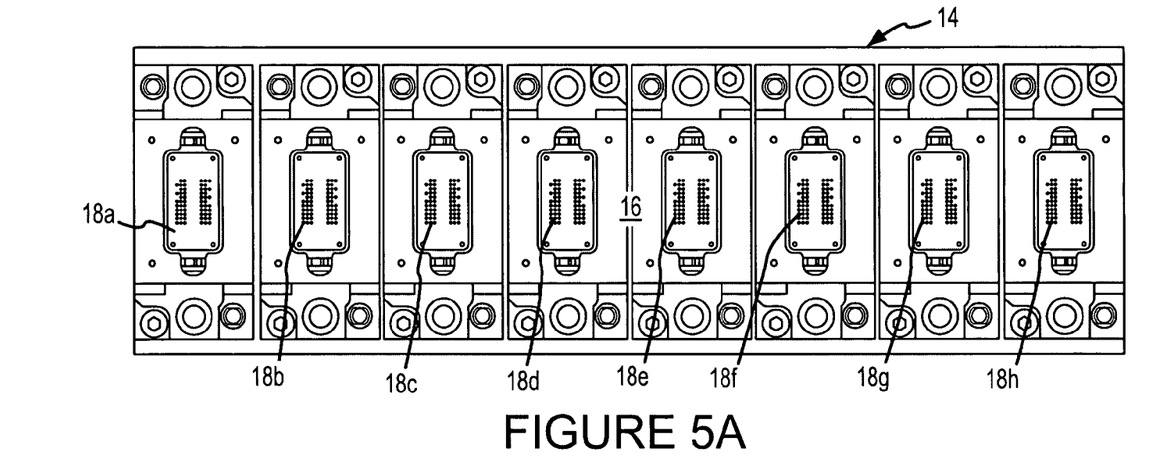
FIGS. 5A and 5B are top and bottom plan views, respectively, of a load board containing a tester circuit used in the test system of FIG. 1.
Figure 5B:
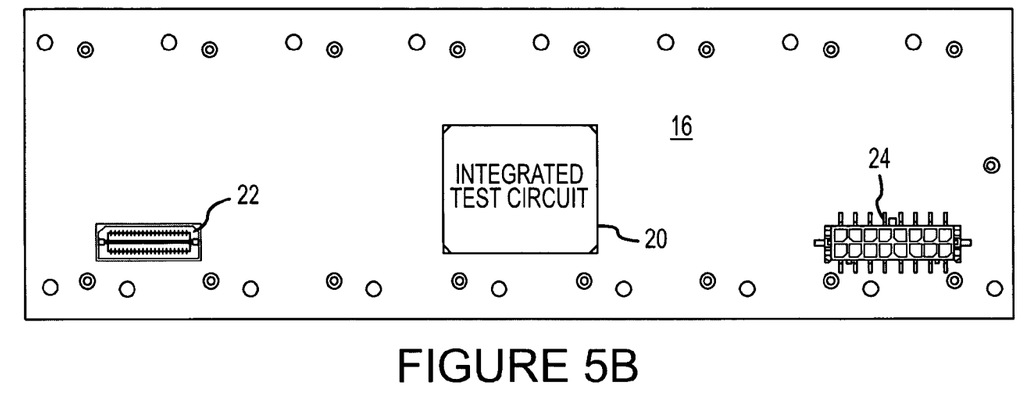

As explained in greater detail below, each of the load boards 14a-d includes an integrated test circuit (not shown in FIG. 4) mounted on the surface of the substrate 16 opposite the service on which the sockets 18a-h are mounted. The sockets 18a-h are shown mounted on the upper surface of the substrate 16 in greater detail in FIG. 5A. The lower surface of the substrate 16 is shown in FIG. 5B. The integrated test circuit 20 is mounted at the center on the lower surface of the substrate 16, and it is connected to the sockets 18a-h through conventional printed circuit traces (not shown in FIG. 5B).

Also mounted on the lower surface of the substrate 16 are a conventional JTAG connector 22 and a power supply connector 24. A test file containing test instructions, such as the characteristics of memory commands used by memory devices in the sockets 18a-h or the address range to be tested, are applied to the integrated test circuit 20 through the JTAG connector 22. The test file is stored in random access memory ("RAM") internal to the integrated test circuit 20. Results data are subsequently received from the integrated test circuit 20 through the JTAG connector 22. Power is applied to the integrated test circuit 20 as well as to integrated circuits mounted in the sockets 18a-h through the power supply connector 24. The integrated test circuit 20 includes a command generator (not shown) that generates memory command signals, and an address generator (not shown) that generates memory address signals. The integrated test circuit 20 also contains a write data generator (not shown) including a pattern generator that generates a pattern of write data signals.

In operation, the integrated test circuit 20 write a pattern of signals to the integrated circuits mounted in the sockets 18a-h by coupling appropriate command and address signals, as well as the pattern of write data, to the integrated circuits mounted in the sockets 18a-h. In response to coupling appropriate command and address signals generated by the integrated test circuit 20, the integrated test circuit 20 receives read data from the integrated circuits. The integrated test circuit 20 compares the read data to the write data to determine if the integrated circuits in the sockets 18a-h are functioning properly. Insofar as the integrated test circuit 20 is mounted on the same substrate 16 as the integrated circuits, the timing at which the signals in the pattern are applied to the integrated circuits can be more precisely controlled. Furthermore, the relatively short length of the conductors extending from the integrated test circuit 20 to the integrated circuits in the sockets 18a-h allows the circuitry in the integrated test circuit 20 to be less complex and therefore less expensive than with testers in which a pattern of test signals is applied through a long cable.

With further reference to FIG. 4, the test head 12 is mounted on the upper ends of several power supplies 26a-d, which generate DC supply voltages at respective magnitudes for use by the test head 12 and the load boards 14a-d. As mentioned above, the DC supply voltages are applied to the test head 12 through the power supply connector 24 (FIG. 5B). The test head 12 also includes fluid couplings 29a,b that receive and discharge a cooling fluid, respectively, for maintaining the temperature of the integrated test circuit 20 at a constant, acceptably cool temperature.

Figure 6:
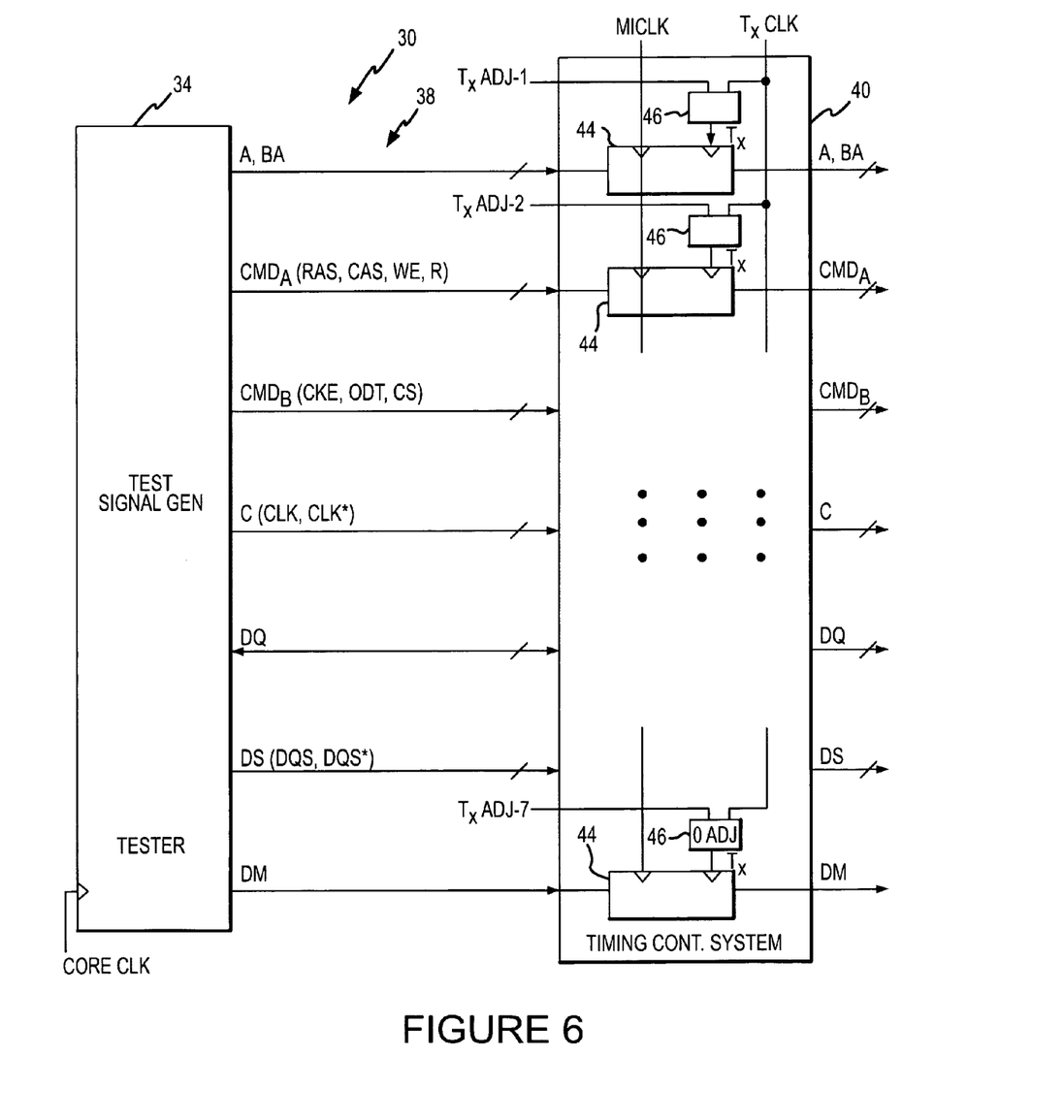
FIG. 6 is a block diagram of one example of the tester circuit contained on the load board of FIGS. 5A and 5B.

A block diagram of a testing system 30 that may be used in the integrated test circuit 20 according to one example of the invention is shown in FIG. 6. The testing system 30 includes a test signal generator 34 that outputs a plurality of memory device command, address and data signals responsive to a core clock ("CoreCLK") signal. These signals are shown as being output through a plurality of signal lines 38, which are shown in FIG. 6 as buses. A first set of lines outputs respective address ("A") signals and bank address ("BA") signals from the test signal generator 34. A second set of signal lines outputs a first set of respective command ("$CMD_A$") signals from the test signal generator 34. These $CMD_A$ signals may include a row address select ("RAS") signal, a column address select ("CAS") signal, a write enable ("WE") signal, and a reset ("R") signal. A third set of signal lines outputs a second set of respective command ("$CMD_B$") signals from the test signal generator 34. These $CMD_B$ signals may include a clock enable ("CKE") signal, an on-die termination ("ODT") signal, and a chip select ("CS") signal. A fourth set of signal lines outputs complementary clock ("C") signals, i.e., CLK and CLK* signals. A fifth set of signal lines outputs respective data ("DQ") signals from the test signal generator 34. A sixth set of signal lines outputs complementary data strobe ("DS") signals, i.e., DQS and DQS* signals. Finally, a seventh set containing a single signal line outputs a data mask ("DM") signal from the test signal generator 34.

Although the test signal generator 34 is described and shown in FIG. 6 as outputting specific memory device signals, it will be understood it may alternatively output other memory device signals, such as those that are specific to DRAM devices, static random access ("SRAM") devices, read only memory ("ROM") devices, as well as other types of memory devices. Further, the test signal generator 34 may alternatively output other types of signals to devices other than memory devices.

The memory device signals from the test signal generator 34 that are output on signal lines 38 shown as a common bus are considered to be in a common "pin group." As explained in greater detail below, the timing at which the memory device signals in the same pin group are applied to a memory device being tested may be adjusted independently of the timing at which the memory device signals in other pin groups are applied to the memory device. Furthermore, the timing at which the memory device signals in the pin groups are applied to the memory device may be adjusted over a wide range.

With further reference to FIG. 6, the memory device signals output from the test signal generator 34 are applied to a timing control system 40. More specifically, each of the memory device signals is applied to a respective timing circuit 44, which applies corresponding signals at a controllable time to a memory device being tested. Although a single timing circuit 44 is shown for each pin group of memory device signals, it should be understood that a separate timing circuit 44 is provided for each memory device signal. All of the timing circuits are coupled to receive a common memory interface clock ("MICLK") signal, which, in the example of the test system 30 shown in FIG. 6, has a frequency that is twice the frequency of the CoreCLK. The timing circuits 34 in each pin group are also coupled to receive a common transmit clock ("Tx") signal, which is generated by a respective phase adjustment circuit 46. Each phase adjustment circuit 46 receives a respective adjustment ("TxAdj") signal, and all of the phase adjustment circuits 46 receives a common transmit clock ("TxCLK") signal. In one embodiment, the phase adjustment circuit 46 may be implemented using a conventional phase interpolator (not shown), which receives the TxCLK signal at its clock input. As is well-known in the art, a phase interpolator is able to produce from an input signal a delayed signal that has a phase relative to the input signal that can be precisely controlled. The degree of precision of the delay depends on the precision of the input signal frequency, and is thus not adversely affected by process, supply voltage or temperature variations. A phase interpolator can, for example, vary the delay of the TxCLK signal in 1 nanosecond increments by using an input signal having a frequency of 6.4 mHz and using a phase interpolator having 256 phase increments. The phase shift of the phase interpolator can be controlled by the TxAdj signal so that the Tx signal applied to the respective timing circuit 44 is delayed from the TxAdj signal by the value of the respective TxAdj signal.

In operation, a respective memory device signal is clocked into the respective timing circuit 44 by the MICLK signal. The memory device signal stored in the respective timing circuit 44 is then clocked out of the timing circuit 44 and applied to a memory device being tested responsive to the Tx signal from the phase adjustment circuit 46 of the pin group for the memory device signal. In one embodiment, the phase adjustment circuit 46 may be implemented. The timing at which each memory device signal is applied to the memory device under test is determined by the timing of the Tx signal, which is, in turn, determined by the TxAdj signal for the respective pin group. The TxAdj signal is determined by means that are conventionally used for testers, such as testers for memory devices, that adjust the timing at which test signals are applied to a device under test. Similarly, the manner in which the phase adjustment circuit 46 can adjust the timing of the Tx signal responsive to the TxAdj signal is conventional.

As explained in greater detail below, the timing circuit 44 receives and stores memory device signals for a plurality of memory device accesses. Furthermore, the memory device signals are coupled from the test signal generator 34 to the timing circuit 44 and from the timing circuit 44 to the memory device being tested with increasingly narrow bus widths but increasingly high rates so that the signal transfer rate, i.e., the number of bits/second, remains constant. As also explained below, the timing circuit 44 for the DQ signals are different from the timing circuit 44 for the remaining signals shown in FIG. 6.

Figure 7:
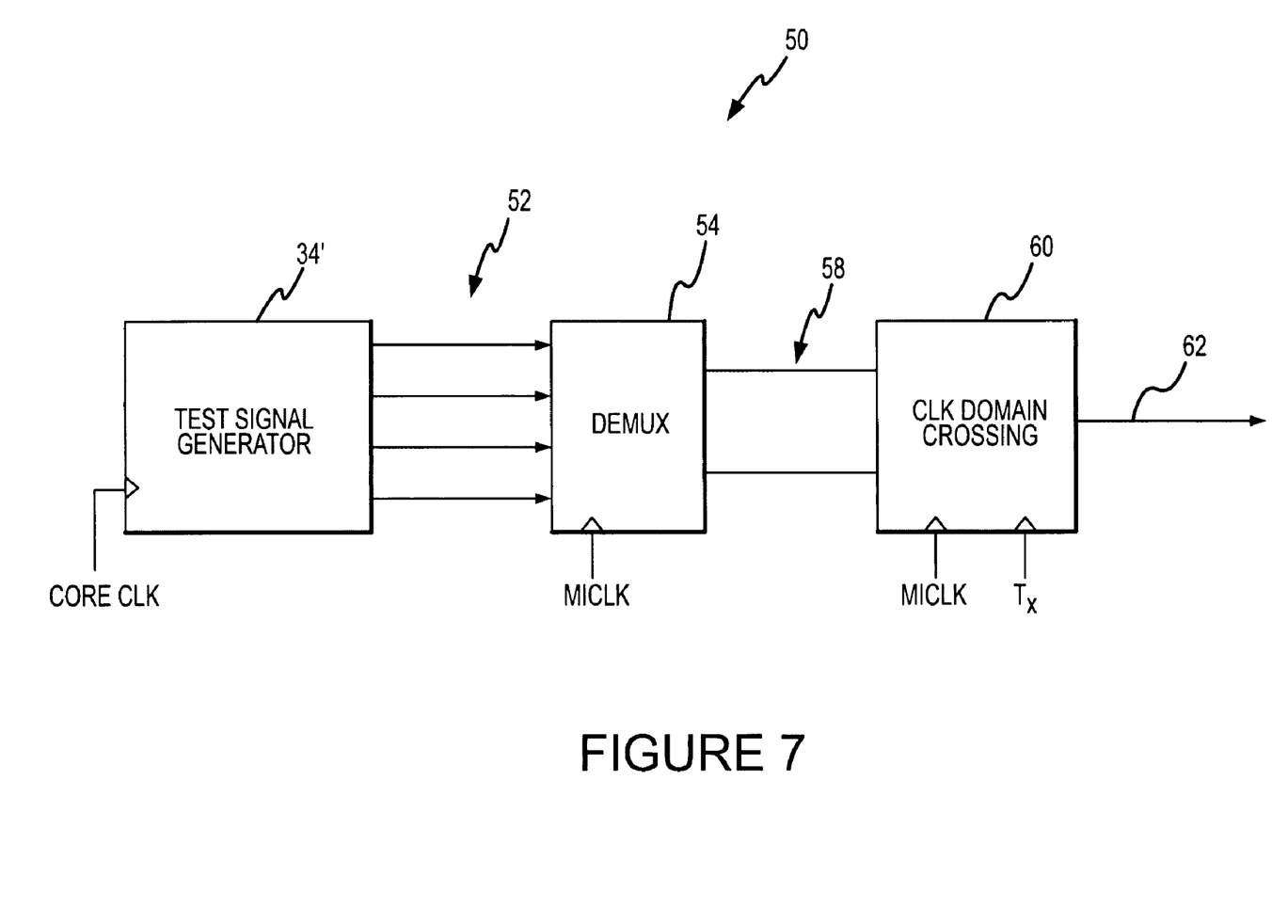
FIG. 7 is a block diagram of one example of a timing circuit used in the tester circuit of FIG. 6.

One example of a timing circuit 50 that may be used as the timing circuit 44 for the memory device signals other than the DQ signals is shown in FIG. 7. Also shown in FIG. 7 is a portion 34' of the test signal generator 34 (FIG. 6) that generates each memory device signal. As shown in FIG. 7, the test signal generator 34' outputs a memory device signal, e.g., a command signal, for four memory accesses each CoreCLK period. The signals for these four memory accesses are output on respective signal lines 52 and applied to a demultiplexer 54. The demultiplexer 54 also receives the MICLK signal, which has a frequency that is twice the frequency of the CoreCLK signal. The demultiplexer 54 couples each of two memory device signals output from the test signal generator 34' on respective signal lines 52 to one of two signal lines 58 responsive to respective periods of the MICLK signal. On the first rising edge of the MICLK signal, the demultiplexer 54 couples the memory device signal output from the test signal generator 34' on the first signal line 52 to the first signal line 58 and it couples the memory device signal output from the test signal generator 34' on the second signal line 52 to the second signal line 58. The demultiplexer 54 operates in the same manner to couple the memory device signals output from the test signal generator 34' on the two lower signal lines 52 to respective signal lines 58 on the second rising edge of the MICLK signal.

The memory device signals sequentially output from the demultiplexer 54 on successive periods of the MICLK signal are applied to a clock domain crossing circuit 60. The clock domain crossing circuit 60 also receives the MICLK signal and the Tx signal, which has a frequency that is twice the frequency of the MICLK signal. The clock domain crossing circuit 60 performs two functions. First, it operates like the demultiplexer 54 to couple the four memory device signals output from the demultiplexer 54 on the two signal lines 58 to a single signal line 62. The clock domain crossing circuit 60 is able to perform this function because, as mentioned above, the Tx signal has a frequency that is twice the frequency of the MICLK signal. As a result, a first memory device signal is clocked into the clock domain crossing circuit 60 from the upper of the signal lines 58 on the first rising edge of the MICLK signal, and this signal is clocked out of the clock domain crossing circuit 60 on the first rising edge of the Tx signal. A second memory device signal is also clocked into the clock domain crossing circuit 60 from the lower of the signal lines 58 on the first rising edge of the MICLK signal, and this signal is clocked out of the clock domain crossing circuit 60 on the second rising edge of the Tx signal. A third memory device signal is clocked into the clock domain crossing circuit 60 from the upper of the signal lines 58 on the second rising edge of the MICLK signal, and this signal is clocked out of the clock domain crossing circuit 60 on the third rising edge of the Tx signal. Finally, a fourth memory device signal is clocked into the clock domain crossing circuit 60 from the lower of the signal lines 58 on the second rising edge of the MICLK signal, and this signal is clocked out of the clock domain crossing circuit 60 on the fourth rising edge of the Tx signal.

The second function performed by the clock domain crossing circuit 60 is to control the timing at which each of the memory device signals are output from the clock domain crossing circuit 60. The MICLK signal and the Tx signal are in different clock domains so that the timing relationship between them can vary. As a result, the timing of the Tx signal can vary to control the timing at which the memory device signals are output from the clock domain crossing circuit 60. Moreover, as explained in greater detail below, the timing of the Tx signal can be adjusted over a considerable range without violating set-up and hold times for the memory device signals.

Figure 8:
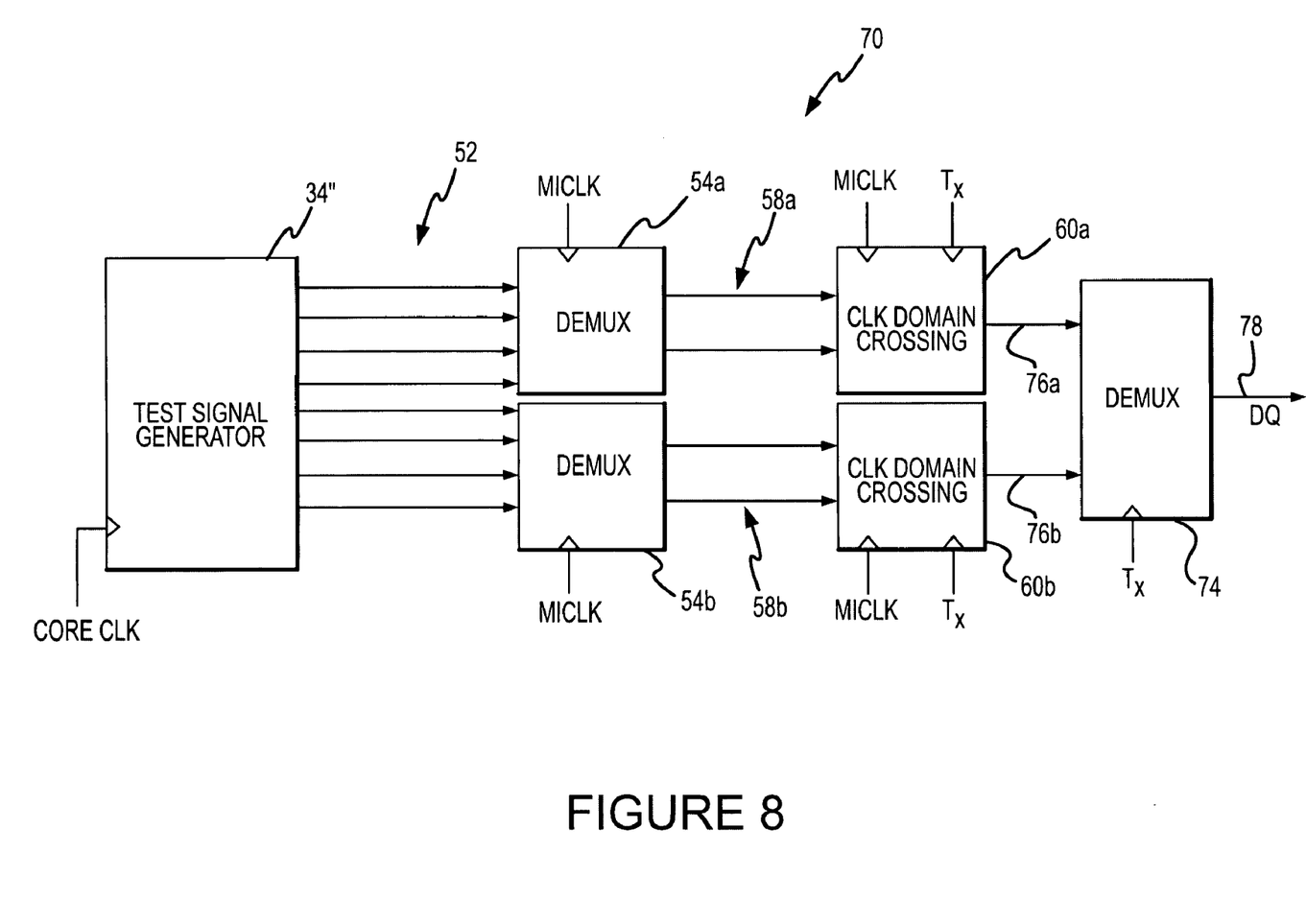
FIG. 8 is a block diagram of another example of a timing circuit used in the tester circuit of FIG. 6.

One example of a timing circuit 70 that may be used as the timing circuit 44 for the DQ signals is shown in FIG. 8. The timing circuit 70 is similar to the timing circuit 50 shown in FIG. 7 that is used for the memory device signals other than the DQ signals. Again, a portion 34" of the test signal generator 34 (FIG. 6) that generates each memory device signal is shown. The timing circuit 70 differs from the timing circuit 50 because of the need to process eight rather than four DQ signals output from the test signal generator 34" each CoreCLK period. The timing circuit 70 includes two of the demultiplexer 54a,b each of which receives four DQ signals on respective signal lines 52 each CoreCLK period. Each demultiplexer 54 operates in the same manner as the demultiplexer 54 used in the timing circuit 50 of FIG. 7 to output the received signals on two signal lines 58a,b on the two successive rising edges of the MICLK signal.

The DQ signals output from each of the demultiplexers 54a,b are applied through the signal lines 58a,b to respective clock domain crossing circuits 60a,b, each of which operates in the same manner as the clock domain crossing circuit 60 used in the timing circuit 50. Thus, the DQ signal output from the test signal generator 34" on the first of the signals lines 54 is output from the clock domain crossing circuit 60a on the first rising edge of the Tx signal at the same time that the DQ signal output from the test signal generator 34" on the fifth of the signals lines 54 is output from the clock domain crossing circuit 60b. The DQ signal output from the test signal generator 34" on the second of the signals lines 54 is output from the clock domain crossing circuit 60a on the second rising edge of the Tx signal at the same time that the DQ signal output from the test signal generator 34" on the sixth of the signals lines 54 is output from the clock domain crossing circuit 60b, and so forth.

Insofar as each DQ signal is applied to a memory device being tested on a single terminal, the DQ signals from the clock domain crossing circuits 60a,b must be combined into a single data stream. This is accomplished using an additional demultiplexer 74, which is coupled to the output of each of the clock domain crossing circuits 60a,b through signal lines 76a,b. The demultiplexer 74 outputs the DQ signals on line 78 responsive to the Tx signal. More specifically, the DQ signals are clocked out of the clock domain crossing circuits 60a,b only on the rising edge of the MICLK signal, but they are clocked out of the demultiplexer 74 on both the rising and falling edges of the Tx signal. Thus, the DQ signal output from the clock domain crossing circuit 60a and the DQ signal output from the clock domain crossing circuit 60b on the first rising edge of the Tx signal are output from the demultiplexer 74 on the first rising edge of the Tx signal and the first falling edge of the Tx signal, respectively. The DQ signal output from the clock domain crossing circuit 60a and the DQ signal output from the clock domain crossing circuit 60b on the second rising edge of the Tx signal are output from the demultiplexer 74 on the second rising edge of the Tx signal and the second falling edge of the Tx signal, respectively. The operation proceeds in this manner until the DQ signal output from the clock domain crossing circuit 60a and the DQ signal output from the clock domain crossing circuit 60b on the fourth rising edge of the Tx signal are output from the demultiplexer 74 on the fourth rising edge of the Tx signal and the fourth falling edge of the Tx signal, respectively.

Tracing these signals back to the test signal generator 34", the DQ signal output from the test signal generator 34" on the first of the signal lines 54 is output from the demultiplexer 74 on the first rising edge of the Tx signal, and the DQ signal output on the fifth signal line 54 is output from the demultiplexer 74 on the first falling edge of the Tx signal. The DQ signal output from the test signal generator 34" on the second signal line 54 is output from the demultiplexer 74 on the second rising edge of the Tx signal, and the DQ signal output on the sixth signal line 54 is output from the demultiplexer 74 on the second falling edge of the Tx signal, and so forth. Finally, the DQ signal output from the test signal generator 34" on the fourth signal line 54 is output from the demultiplexer 74 on the fourth rising edge of the Tx signal, and the DQ signal output on the eighth signal line 54 is output from the demultiplexer 74 on the fourth falling edge of the Tx signal.

Figure 9:
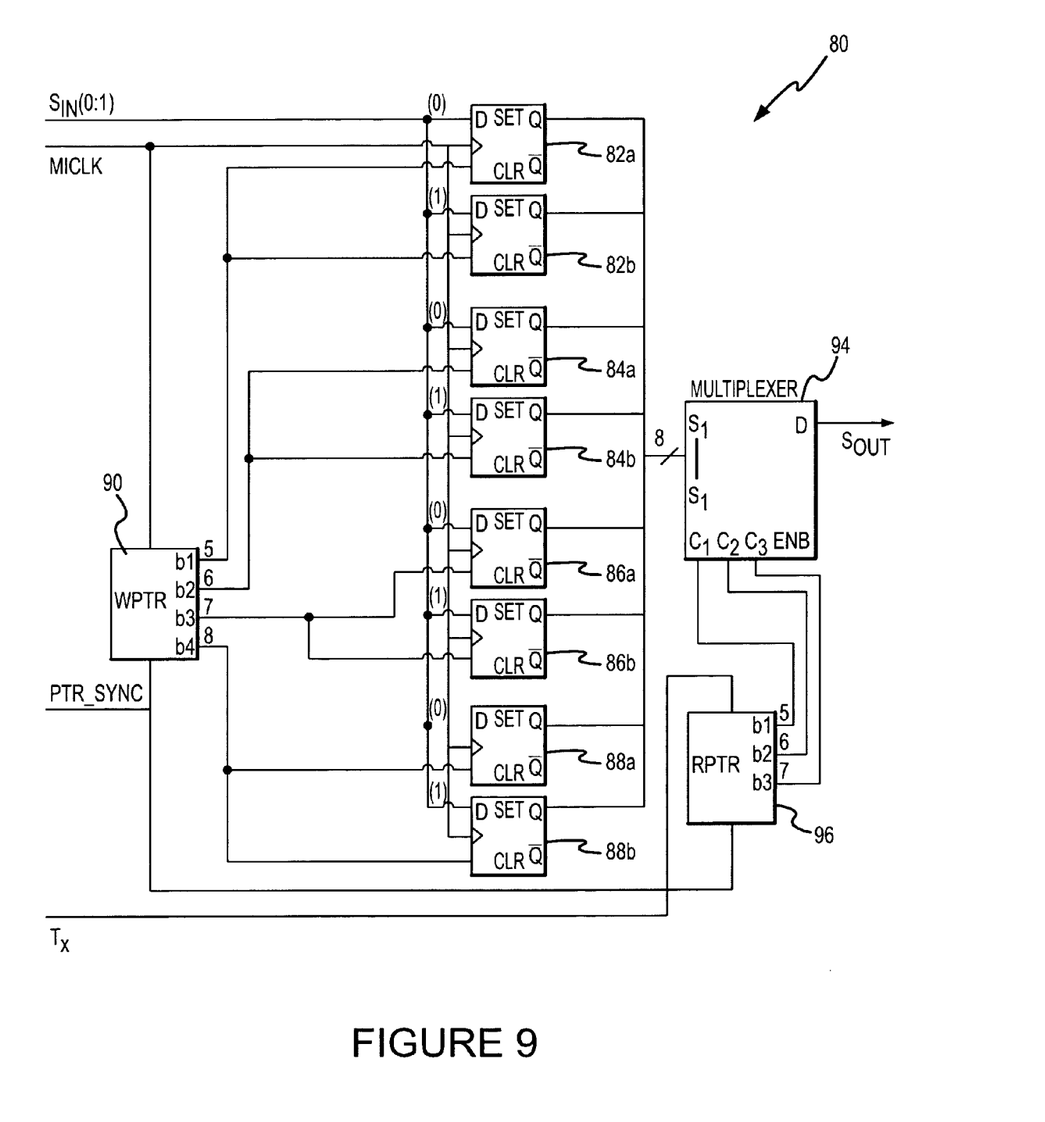
FIG. 9 is a logic diagram showing a clock domain crossing circuit according to one example of the invention, which may be used in the timing circuits of FIGS. 7 and 8.

A clock domain crossing circuit 80 according to one example of the invention that can be used as the clock domain crossing circuit 60 in the timing circuits 50, 70 is shown in FIG. 9. The clock domain crossing circuit 80 is basically an 8-stage ring buffer in which two input signals $S_{IN}<0:1>$ are clocked into one of the stages responsive to the MICLK signal and an output signal $S_{OUT}$ is clocked from one of the stages responsive to the Tx signal. The stage into which the $S_{IN}<0:1>$ signals are clocked increments with each period of the MICLK signal, and the stage from which the $S_{OUT}$ signal is clocked increments with each period of the Tx signal. However, the stage from which the $S_{OUT}$ signal is clocked is always "opposite" the stage into which the $S_{IN}<0:1>$ signals are being clocked. As explained below, this opposite staging permits the timing of the $S_{OUT}$ signal to be adjusted over several periods of the Tx signal.

With further reference to FIG. 9, the $S_{IN}<0>$ signal is applied to the data input of each of eight flip-flops 82a-88a, and the $S_{IN}<1>$ signal is applied to the data input of each of eight flip-flops 82b-88b. The MICLK signal is applied to the clock input of each of the eight flip-flops 82a,b-88a,b. The flip-flops 82a,b-88a,b each have an enable input that is coupled to a write pointer circuit 90, which may simply be a binary counter coupled to a count decoder. The write pointer circuit 90 is clocked by the MICLK signal, to sequentially drive each of its four outputs active high. Thus, the flip-flops 82a,b are enabled responsive to the first rising edge of the MICLK signal, the flip-flops 84a,b are enabled responsive to the second rising edge of the MICLK signal, the flip-flops 86a,b are enabled responsive to the third rising edge of the MICLK signal, and the flip-flops 88*a,b* are enabled responsive to the fourth rising edge of the MICLK signal. The pairs of flip-flops 82*a,b*-88*a,b* are therefore enabled in sequence responsive to the MICLK signal to store eight memory device signals. Insofar as only four memory device signals for four respective memory accesses are generated by the test signal generator 45 (FIGS. 7 and 8) for each CoreCLK period, the clock domain crossing circuit 80 stores memory device signals generated over two CoreCLK periods, which provide memory device signals for eight memory accesses. However, it will be understood that a greater or lesser number of memory device signals may be stored in the clock domain crossing circuit 80.

In operation, it will be recalled that the clock domain crossing circuit 60 (FIGS. 7 and 8) receives two memory device signals responsive to the MICLK signal. The $S_{IN}<0:1>$ signals are first clocked into the respective flip-flops 82*a,b* responsive to the rising edge of the MICLK signal. The rising edge of the MICLK signal also increments the write pointer circuit 90 so that, on the next rising edge of the MICLK signal, the flip-flops 84*a,b* are enabled, thereby causing the $S_{IN}<0:1>$ signals to be clocked into the respective flip-flops 84*a,b*. In this manner the $S_{IN}<0:1>$ signals are sequentially clocked into the respective flip-flops 82*a,b*-88*a,b*.

After the $S_{IN}<0:1>$ have been stored in the flip-flops 82*a,b*-88*a,b*, the stored signals are applied to respective inputs of an 8-input multiplexer 94. The multiplexer 94 is controlled by a 3-bit binary output from a read pointer circuit 96. The read pointer circuit 96, which may simply be a binary counter, is incremented by the Tx signal, so that the binary output sequentially increments. As the binary output of the read pointer circuit 96 increments, it sequentially couples each of its input to an output. Therefore, the $S_{OUT}$ signal is obtained from the output of the flip-flop 82*a* responsive to the first rising edge of the Tx signal, from the output of the flip-flop 82*b* responsive to the second rising edge of the Tx signal, from the output of the flip-flop 84*a* responsive to the third rising edge of the Tx signal, etc.

As mentioned above, the stage of the ring buffer from which the $S_{OUT}$ signal is obtained is opposite the stage into which the $S_{IN}<0:1>$ signals are stored. This relationship is implemented responsive to a PTR_SYNC pulse, which is generated at power-up. In response to PTR_SYNC pulse, the write pointer circuit 90 is reset to one, thereby enabling the flip-flops 82*a,b*. At the same time, the PTR_SYNC pulse resets the read pointer circuit 96 to binary 4 so that the $S_{OUT}$ signal is obtained from the output of the flip-flop 86*a*. Therefore, the timing of the Tx signal can be varied forwardly or backwardly for up to three period of the Tx signal without loosing the ability for the $S_{OUT}$ signal to be obtained from the SIN<0:1> signals. The relatively large range of adjustment insures that the timing at which the memory device signals are applied to a memory device under test can be adjusted to compensate for differences in propagation times of the memory device signals. Also, as mentioned above, varying the times that different pin groups of memory device signals are applied to a memory device under test can be used to determine various timing parameters, such as the setup and hold times, of the memory device under test.

Although the present invention has been described with reference to the disclosed examples, persons skilled in the art will recognize that changes may be made in form and detail without departing from the spirit and scope of the invention. For example, although the disclosed example of the invention adjusts the timing of pin groups of memory device signals independently of the timing of other pin groups of memory device signals, it will be understood that the time of each memory device signal may be independently adjusted using similar means. Such modifications are well within the skill of those ordinarily skilled in the art. Accordingly, the invention is not limited except as by the appended claims.

We claim:

1. A clock domain crossing circuit operable to couple a memory device signal from a first clock domain defined by a first clock signal to a second clock domain defined by a second clock signal, the clock domain crossing circuit comprising:
   a timing adjustment circuit coupled to receive the second clock signal, the timing adjustment circuit generating a plurality of transmit clock signals each of which have a timing relative to the second clock signal that is controlled by a timing adjustment signal; and
   a plurality of ring buffers each of which is coupled to receive a respective one of a plurality of memory device signals and operable responsive to a plurality of transitions of the first clock signal to store the respective memory device signal for a plurality of memory accesses, the ring buffer further being operable responsive to transitions of one of the transmit clock signals to sequentially output the stored memory device signal for the plurality of memory accesses.

2. The clock domain crossing circuit of claim 1 wherein the memory device signals comprise command, address and write data signals, and wherein all of the ring buffers that receive a respective one of the write data signals output the respective write data signals responsive to transitions of the same transmit clock signal.

3. The clock domain crossing circuit of claim 2 wherein the transmit clock signal responsive to which the write data signals are output from their respective ring buffers, is different from the transmit clock signal, to which the command and address signals are output from their respective ring buffers.

4. The clock domain crossing circuit of claim 1 wherein the memory device signals comprise command, address and write data signals, and wherein all of the ring buffers, that receive a respective one of the command signals, output the respective command signals responsive to transitions of the same transmit clock signal.

5. The clock domain crossing circuit of claim 4 wherein the transmit clock signal responsive to which the command signals are output from their respective ring buffers is different from the transmit clock signal to which the address and write data signals are output from their respective ring buffers.

6. The clock domain crossing circuit of claim 1 wherein the memory device signals comprise command, address and write data signals, and wherein all of the ring buffers that receive a respective one of the address signals output the respective address signals responsive to transitions of the same transmit clock signal.

7. The clock domain crossing circuit of claim 1 wherein the frequency of the second clock signal is greater than the frequency of the first clock signal.

8. The clock domain crossing circuit of claim 1 wherein the memory access for which a memory device signal is being output from a respective ring buffer responsive to a transition of the transmit clock signal is N/2 memory accesses after the memory access for which a memory device signal is being stored in the ring buffer responsive to a transition of the first clock signal, where N is the number of memory accesses for which the memory device signal is stored in the ring buffer.

9. The clock domain crossing circuit of claim 8 wherein each of the ring buffers stores a respective one of the memory devices signals for at least eight memory accesses.

10. A system for testing a memory device, comprising:
a test signal generator operable to generate a plurality of memory device signals, including command signals, address signals and write data signals;
a timing adjustment circuit coupled to receive a first clock signal, the timing adjustment circuit generating a plurality of transmit clock signals each of which have a timing relative to the first clock signal that is controlled by a timing adjustment signal; and
a plurality of ring buffers each of which is coupled to the test signal generator and being operable to receive a respective one of the plurality of memory device signals, the ring buffer being operable responsive to a plurality of transitions of a second clock signal to store the respective memory device signal for a plurality of memory accesses, the ring buffer further being operable responsive to transitions of one of the transmit clock signals to sequentially apply the stored memory device signal for the plurality of memory accesses to the memory device being tested.

11. The testing system of claim 10 wherein all of the ring buffers that receive a respective one of the write data signals output the respective write data signals responsive to transitions of the same transmit clock signal.

12. The testing system of claim 11 wherein the transmit clock signal responsive to which the write data signals are output from their respective ring buffers is different from the transmit clock signal to which the command and address signals are output from their respective ring buffers.

13. The testing system of claim 10 wherein all of the ring buffers that receive a respective one of the command signals output the respective command signals responsive to transitions of the same transmit clock signal.

14. The testing system of claim 13 wherein the transmit clock signal responsive to which the command signals are output from their respective ring buffers is different from the transmit clock signal to which the address and write data signals are output from their respective ring buffers.

15. The testing system of claim 10 all of the ring buffers that receive a respective one of the address signals output the respective address signals responsive to transitions of the same transmit clock signal.

16. The testing system of claim 10 wherein the frequency of the first clock signal is greater than the frequency of the second clock signal.

17. The testing system of claim 10 wherein the memory access for which a memory device signal is being output from a respective ring buffer responsive to a transition of the transmit clock signal is N/2 memory accesses after the memory access for which a memory device signal is being stored in the ring buffer responsive to a transition of the second clock signal, where N is the number of memory accesses for which the memory device signal is stored in the ring buffer.

18. The testing system of claim 17 wherein each of the ring buffers stores a respective one of the memory devices signals for at least eight memory accesses.

19. The testing system of claim 10, further comprising a load board operable to removably receive the integrated circuits, the load board having mounted thereon the test signal generator, the timing adjustment circuit, and the plurality of ring buffers.

20. The testing system of claim 19 wherein the test signal generator, the timing adjustment circuit, and the plurality of ring buffers are implemented as a single integrated circuit mounted on the load board.

21. A method of coupling a plurality of memory device signals to a memory device, the method comprising:
storing each of the memory device signals for a plurality of memory accesses responsive to transitions of a first clock signal;
applying the stored memory devices signals for the plurality of memory accesses to the memory device responsive to transitions of a respective one of a plurality of second clock signals; and
adjusting the timing of at least one of the second clock signals used to apply at least one of the stored memory device signals to the memory device relative to the timing of one of the second clock signals used to apply another of the stored memory device signals to the memory device.

22. The method of claim 21 wherein the memory device signals comprise command, address and write data signals, and wherein the same one of the second clock signals is used to apply all of the write data signals to the memory device.

23. The method of claim 22 wherein the second clock signal that is used to apply the write data signals to the memory device is different from the second clock signal that is used to apply the command and address signals to the memory device.

24. The method of claim 21 wherein the memory device signals comprise command, address and write data signals, and wherein the same one of the second clock signals is used to apply all of the command signals to the memory device.

25. The method of claim 24 wherein the second clock signal that is used to apply the command signals to the memory device is different from the second clock signal that is used to apply the address and write data signals to the memory device.

26. The method of claim 21 wherein the memory device signals comprise command, address and write data signals, and wherein the same one of the second clock signals is used to apply all of the address signals to the memory device.

27. The method of claim 21 wherein the frequency of the second clock signal is greater than the frequency of the first clock signal.

28. The method of claim 21 wherein the memory access for which one of the stored memory device signals is being applied to the memory device responsive to a transition of a respective one of a plurality of second clock signals is N/2 memory accesses after the memory access for which another one of the memory device signals is being stored responsive to a transition of the first clock signal, where N is the number of memory accesses for which the memory device signal is stored.

29. The method of claim 28 wherein the act of storing each of the memory device signals for a plurality of memory accesses responsive to transitions of a first clock signal comprises storing each of the memory device signals for at least eight memory accesses responsive to transitions of the first clock signal.

* * * * *

UNITED STATES PATENT AND TRADEMARK OFFICE
CERTIFICATE OF CORRECTION

PATENT NO. : 7,526,704 B2 Page 1 of 1
APPLICATION NO. : 11/210406
DATED : April 28, 2009
INVENTOR(S) : LaBerge It is certified that error appears in the above-identified patent and that said Letters Patent is hereby corrected as shown below:

In column 10, line 28, in Claim 2, delete "buffers" and insert -- buffers, --, therefor.

In column 10, line 29, in Claim 2, delete "signals" and insert -- signals, --, therefor.

In column 10, line 34, in Claim 3, delete "buffers," and insert -- buffers --, therefor.

In column 10, line 35, in Claim 3, delete "signal," and insert -- signal --, therefor.

Signed and Sealed this

Fourteenth Day of July, 2009

JOHN DOLL
*Acting Director of the United States Patent and Trademark Office*